(12) United States Patent
Pawlik et al.

(10) Patent No.: US 9,248,627 B2
(45) Date of Patent: Feb. 2, 2016

(54) MULTILAYER FILM HAVING POLYAMIDE AND POLYPROPYLENE LAYERS

(71) Applicants: Andreas Pawlik, Recklinghausen (DE); Martin Wielpuetz, Senden (DE); Harald Haeger, Luedinghausen (DE)

(72) Inventors: Andreas Pawlik, Recklinghausen (DE); Martin Wielpuetz, Senden (DE); Harald Haeger, Luedinghausen (DE)

(73) Assignee: EVONIK DEGUSSA GmbH, Essen (DE)

( * ) Notice: Subject to any disclaimer, the term of this patent is extended or adjusted under 35 U.S.C. 154(b) by 505 days.

(21) Appl. No.: 13/649,379

(22) Filed: Oct. 11, 2012

(65) Prior Publication Data

US 2013/0092232 A1 Apr. 18, 2013

(30) Foreign Application Priority Data

Oct. 14, 2011 (DE) .......................... 10 2011 084 521

(51) Int. Cl.
| | |
|---|---|
| B32B 7/02 | (2006.01) |
| B32B 17/10 | (2006.01) |
| B32B 27/00 | (2006.01) |
| B32B 27/08 | (2006.01) |
| B32B 27/32 | (2006.01) |
| B32B 27/34 | (2006.01) |
| H01L 31/049 | (2014.01) |

(52) U.S. Cl.
CPC ..... *B32B 17/10018* (2013.01); *B32B 17/10036* (2013.01); *B32B 27/08* (2013.01); *B32B 27/32* (2013.01); *B32B 27/34* (2013.01); *H01L 31/049* (2014.12); *B32B 2307/206* (2013.01); *B32B 2457/12* (2013.01); *Y02E 10/50* (2013.01); *Y10T 428/24967* (2015.01); *Y10T 428/24975* (2015.01); *Y10T 428/269* (2015.01); *Y10T 428/31757* (2015.04)

(58) Field of Classification Search
None
See application file for complete search history.

(56) References Cited

U.S. PATENT DOCUMENTS

| | | |
|---|---|---|
| 6,794,048 B2 | 9/2004 | Schmitz et al. |
| 6,861,540 B2 | 3/2005 | Herwig et al. |
| 7,175,896 B2 | 2/2007 | Schmitz et al. |
| 7,608,738 B2 | 10/2009 | Herwig et al. |
| 8,022,201 B2 | 9/2011 | Roos et al. |
| 8,048,504 B2 | 11/2011 | Schmitz et al. |
| 8,133,561 B2 | 3/2012 | Schmitz et al. |
| 8,168,841 B2 | 5/2012 | Herwig et al. |
| 8,232,333 B2 | 7/2012 | Haeger et al. |
| 8,378,127 B2 | 2/2013 | Dingerdissen et al. |
| 8,445,720 B2 | 5/2013 | Hannen et al. |
| 8,871,862 B2 | 10/2014 | Pawlik et al. |
| 9,000,223 B2 | 4/2015 | Micoine et al. |
| 2010/0119841 A1 | 5/2010 | Muckenhuber |
| 2011/0171702 A1 | 7/2011 | Reinecke et al. |
| 2011/0251399 A1 | 10/2011 | Dingerdissen et al. |
| 2012/0028060 A1* | 2/2012 | Etzel et al. .................. 428/473.5 |
| 2012/0034665 A1 | 2/2012 | Haas et al. |
| 2012/0264877 A1 | 10/2012 | Häger et al. |
| 2013/0165685 A1 | 6/2013 | Hannen et al. |
| 2013/0171388 A1 | 7/2013 | Pawlik et al. |
| 2013/0207050 A1 | 8/2013 | Hermasch et al. |
| 2013/0240799 A1 | 9/2013 | Haeger et al. |
| 2013/0299750 A1 | 11/2013 | Hermasch et al. |
| 2014/0141478 A1 | 5/2014 | Schaffer et al. |
| 2014/0178948 A1 | 6/2014 | Schaffer et al. |
| 2014/0186905 A1 | 7/2014 | Schaffer et al. |
| 2014/0242646 A1 | 8/2014 | Pötter et al. |
| 2014/0308717 A1 | 10/2014 | Haas et al. |
| 2015/0111253 A1 | 4/2015 | Schaffer et al. |
| 2015/0111254 A1 | 4/2015 | Hennemann et al. |

FOREIGN PATENT DOCUMENTS

| | | |
|---|---|---|
| CA | 2782097 A1 | 6/2011 |
| EP | 2 422 976 A1 | 2/2012 |
| WO | WO 2008138022 A1 | 11/2008 |
| WO | WO 2011066595 | 6/2011 |

OTHER PUBLICATIONS

European Search Report issued Jan. 15, 2013 in European Patent Application No. 12187747.6 (with English Translation of Categories of Cited Documents).
U.S. Appl. No. 13/649,616, filed Oct. 11, 2012, Pawlik, et al.
U.S. Appl. No. 13/649,319, filed Oct. 11, 2012, Pawlik, et al.
U.S. Appl. No. 13/649,498, filed Oct. 11, 2012, Pawlik, et al.
U.S. Appl. No. 13/649,379, filed Oct. 11, 2012, Pawlik, et al.
U.S. Appl. No. 13/649,562, filed Oct. 11, 2012, Pawlik, et al.
U.S. Appl. No. 14/649,414, filed Jun. 3, 2015, Schaffer et al.

* cited by examiner

*Primary Examiner* — Sheeba Ahmed
(74) *Attorney, Agent, or Firm* — Oblon, McClelland, Maier & Neustadt, L.L.P.

(57) ABSTRACT

Multilayer films of polyamide and polypropylene which have good layer adhesion and are suitable for a back cover of a solar module are provided. In a first embodiment, the multilayer film contains in the order listed: a) a layer containing at least 35% by weight, of polyamide; c) a layer containing at least 35% by weight of a polypropylene; and e) a layer containing at least 35% by weight, of polyamide; wherein the layer c) further comprises a polypropylene having acid anhydride groups or a polypropylene compatible functionalized polyolefin having functional groups to adhere the layer c) to each of layers a) and e). In a second embodiment adhesion promoter layers are present between the respective polyamide and polypropylene layers.

17 Claims, No Drawings

MULTILAYER FILM HAVING POLYAMIDE AND POLYPROPYLENE LAYERS

CROSS REFERENCE TO RELATED APPLICATIONS

This application claims priority to DE 102011084521.6 filed Oct. 14, 2011, the disclosure of which is incorporated herein by reference in its entirety.

BACKGROUND OF THE INVENTION

The invention relates to the use of a multilayer film with polyamide and polypropylene layers for the production of solar modules.

Solar modules, frequently also referred to as photovoltaic modules, serve for electrical power generation from sunlight and consist of a laminate which comprises a solar cell system as the core layer. This core layer is encased with encapsulation materials which serve as protection against mechanical and weathering-related influences.

In conventional solar modules, the active solar cell is positioned between a front cover and a back cover. The front cover is transparent, generally consists of glass; and is bonded by means of an adhesion promoter layer which often contains an ethylene-vinyl acetate copolymer to the layer comprising the solar cell. The back cover provides electric shielding, serves as protection against weathering influences such as UV light and acts as a moisture barrier.

Film composites composed of fluoropolymer films and polyester may conventionally be employed as a back cover. The fluoropolymer film on the outside provides weathering resistance, while the polyester film is utilized to obtain mechanical stability and electrical insulation properties. A further fluoropolymer film on the inside serves for attachment to the sealing layer of the solar cell system. However, such fluoropolymer films have only low adhesion to the sealing layer which is used as embedding material for the solar cells themselves. In addition, the fluoropolymer film contributes to electrical insulation only to a minor degree, which results in the need to use a comparatively thick polyester film.

WO 2008138022 therefore proposes replacing the two fluoropolymer films in such composites with films of nylon-12 (PA12). In a development thereof, WO 2011066595 proposes that the solar cell-facing thermoplastic layer comprise a light-reflecting filler such as titanium dioxide, while the solar cell-remote thermoplastic layer comprise a second filler such as glass fibres, wollastonite or mica, which brings about a higher thermal conductivity of this layer. Illustrative thermoplastics come from the group of the polyamides, polyesters or blends of polyamide and polyolefin. Explicit mention is made of PA11, PA12 and PA1010, and blends thereof with polyolefins.

The combination of polyamide layers and polypropylene layers in an assembly of this kind would be of advantage on account of the very good electrical insulation properties. However, such a thermoplastic combination does not achieve sufficient adhesion of the layers.

SUMMARY OF THE INVENTION

It is therefore an object of the invention to provide a multilayer film having improved adhesion between polyamide-based layers and layers comprising polyamide and polypropylene.

Another object of this invention is to provide a multilayer film of polyamide and polypropylene layers having effective electrical insulation which is suitable as a backing film of a photovoltaic module.

A further object of the invention is to provide a photovoltaic module having improved stability of polyamide and polypropylene layers.

These and other objects have been achieved by the present invention, the first embodiment of which includes a multilayer film, comprising, in the order listed:

a) a layer of a moulding composition which comprises at least 35% by weight, based on the overall layer moulding composition, of polyamide;

c) a layer of a moulding composition which comprises at least 35% by weight, based on the overall layer moulding composition, of a polypropylene;

e) a layer of a moulding composition which comprises at least 35% by weight, based on the overall moulding composition, of polyamide;

wherein the layer c) further comprises a polypropylene having acid anhydride groups in a concentration sufficient to adhere the layer c) to each of layer a) and e), or the layer c) further comprises a polypropylene compatible functionalized polyolefin having a sufficient number of functional groups to adhere the layer c) to each of layers a) and e).

In a second embodiment, the present invention provides a multilayer film, comprising, in the order listed:

a) a layer of a moulding composition which comprises at least 35% by weight, based on the overall layer moulding composition, of polyamide;

b) an adhesion promoter layer;

c) a layer of a moulding composition which comprises at least 35% by weight, based on the overall layer moulding composition, of a polypropylene;

d) an adhesion promoter layer; and e) a layer of a moulding composition which comprises at least 35% by weight, based on the overall moulding composition, of polyamide;

wherein the adhesion promoter layers b) and d) each comprise copolymers having a sufficient quantity of functional groups to adhere to the layer c) and to each of layer a) and e).

In a preferred embodiment, the present invention provides a photovoltaic module, comprising;

a solar cell embedded in a sealing layer; and the multilayer film according to the above described first embodiment as a back cover;

wherein the layer a) of the multilayer film is bonded to the sealing layer.

In a further preferred embodiment, the present invention provides a photovoltaic module, comprising;

a solar cell embedded in a sealing layer; and the multilayer film according to the above described second embodiment as a back cover;

wherein the layer a) of the multilayer film is bonded to the sealing layer.

DETAILED DESCRIPTION OF THE INVENTION

In a first embodiment the present invention provides a multilayer film, comprising, in the order listed:

a) a layer of a moulding composition which comprises at least 35% by weight, based on the overall layer moulding composition, of polyamide;

c) a layer of a moulding composition which comprises at least 35% by weight, based on the overall layer moulding composition, of a polypropylene;

e) a layer of a moulding composition which comprises at least 35% by weight, based on the overall moulding composition, of polyamide;

wherein the layer c) further comprises a polypropylene having acid anhydride groups in a concentration sufficient to adhere the layer c) to each of layer a) and e), or the layer c) further comprises a polypropylene compatible functionalized polyolefin having a sufficient number of functional groups to adhere the layer c) to each of layers a) and e).

In the layer a) the polyamide content is preferably at least 40% by weight, more preferably at least 45% by weight, especially preferably at least 50% by weight and most preferably at least 55% by weight, based in each case on the overall moulding composition, In the layer c) the proportion of polypropylene is preferably at least 40% by weight, more preferably at least 45% by weight, especially preferably at least 50% by weight and most preferably at least 55% by weight, based in each case on the overall moulding composition, and In the layer e) the polyamide content of is preferably at least 40% by weight, more preferably at least 45% by weight, especially preferably at least 50% by weight and most preferably at least 55% by weight, based in each case on the overall moulding composition.

In this embodiment layer adhesion is obtained by the presence of polypropylene having a concentration of acid anhydride groups sufficient to promote adhesion in the layer c). Either the entire polypropylene of this moulding composition or only part thereof may be functionalized with groups such as acid anhydrides or epoxides. Alternatively, the polypropylene moulding composition may also comprise a functionalized polyolefin which is compatible with it and which provides functional groups, more particularly acid anhydride groups or epoxide groups, sufficiently for attachment to the polyamide layers. Examples of such functionalized polyolefins include copolymers of ethylene, methyl acrylate and/or ethyl acrylate and also glycidyl methacrylate or maleic anhydride (MAn). Such a functionalized polyolefin may be compatible with the polypropylene when it is either molecularly miscible therewith or has been dispersed in a thermodynamically stable manner after compounding in propylene, such that it imparts sufficiently firm phase adhesion to the layers according to a) and e).

In the second embodiment, the present invention provides a multilayer film, comprising, in the order listed:

a) a layer of a moulding composition which comprises at least 35% by weight, based on the overall layer moulding composition, of polyamide;

b) an adhesion promoter layer;

c) a layer of a moulding composition which comprises at least 35% by weight, based on the overall layer moulding composition, of a polypropylene;

d) an adhesion promoter layer; and e) a layer of a moulding composition which comprises at least 35% by weight, based on the overall moulding composition, of polyamide;

wherein the adhesion promoter layers b) and d) each comprise copolymers having a sufficient quantity of functional groups to adhere to the layer c) and to each of layer a) and e).

The nature of the adhesion promoter is not critical. It may be possible to use any adhesion promoter which joins the layers sufficiently firmly to one another, so that they do not delaminate during production and also during subsequent use. In the simplest case, the adhesion promoter may be a polypropylene which contains acid anhydride groups which in a known way, by thermal or free-radical reaction of the polypropylene with an unsaturated dicarboxylic anhydride, an unsaturated dicarboxylic acid or an unsaturated dicarboxylic acid monoalkyl ester, are introduced in a concentration which is sufficient for effective attachment to the polyamide of the adjacent layer. Examples of suitable reagents include maleic acid, maleic anhydride, monobutyl maleate, fumaric acid, aconitic acid or itaconic anhydride. In this way preferably 0.1 to 4% by weight of an unsaturated anhydride may be grafted onto the polypropylene. As conventionally known, the unsaturated dicarboxylic anhydride or its precursor may also be grafted on together with a further unsaturated monomer such as styrene, α-methylstyrene or indene, for example. The adhesion promoter, alternatively, may be a blend of a polyamide with a polypropylene of this kind that carries acid anhydride groups.

Furthermore, the adhesion promoter may also comprise non-functionalized polypropylene. Also suitable are blends of polypropylene with suitable additives such as, for example, copolymers of ethylene, methyl acrylate and/or ethyl acrylate and also glycidyl methacrylate or MAn. Further suitable adhesion promoters are composed of polyamide, functionalized ethylene-propylene rubber and non-functionalized polypropylene. Also suitable are the adhesion promoters disclosed in EP-A-1 216 823. If the adhesion promoter comprises a polyamide, then either the same polyamide may be selected as in the layers according to a) and e), or a polyamide should be selected which is sufficiently compatible therewith to adhere to it.

The polyamide may be a partly crystalline polyamide, for example PA6, PA66, PA610, PA612, PA10, PA810, PA106, PA1010, PA11, PA1011, PA1012, PA1210, PA1212, PA814, PA1014, PA618, PA512, PA613, PA813, PA914, PA1015, PA11, PA12, or a semiaromatic polyamide, called a polyphthalamide (PPA). (The naming of the polyamides corresponds to the international standard, the first number(s) giving the number of carbon atoms of the starting diamine and the last number(s) the number of carbon atoms of the dicarboxylic acid. If only one number is mentioned, this means that the starting material was an α,ω-aminocarboxylic acid or the lactam derived therefrom; for the rest, reference is made to H. Domininghaus, Die Kunststoffe and ihre Eigenschaften [The polymers and their properties], pages 272 ff., VDI-Verlag, 1976.) Suitable PPAs are, for example, PA66/6T, PA6/6T, PA6T/MPMDT (MPMD stands for 2-methylpentamethylenediamine), PA9T, PA10T, PA11T, PA12T, PA14T and copolycondensates of these latter types with an aliphatic diamine and an aliphatic dicarboxylic acid or with an ω-aminocarboxylic acid or a lactam. Partly crystalline polyamides have an enthalpy of fusion of more than 25 J/g, measured by the DSC method to ISO 11357 in the 2nd heating step and integration of the melt peak.

The polyamide may also be a semicrystalline polyamide. Semicrystalline polyamides have an enthalpy of fusion of 4 to 25 J/g, measured by the DSC method to ISO 11357 in the 2nd heating step and integration of the melt peak. Examples of suitable semicrystalline polyamides include The polyamide of 1,10-decanedioic acid or 1,12-dodecanedioic acid and 4,4'-diaminodicyclohexylmethane (PA PACM10 and PA PACM12), proceeding from a 4,4'-diaminodicyclohexylmethane with a trans,trans isomer content of 35 to 65%;

copolymers based on the abovementioned partly crystalline polyamides; and blends of the abovementioned partly crystalline polyamides and a compatible amorphous polyamide.

The polyamide may also be an amorphous polyamide. Amorphous polyamides have an enthalpy of fusion of less than 4 J/g, measured by the DSC method to ISO 11357 in the 2nd heating step and integration of the melt peak. Examples of amorphous polyamides include:

- the polyamide of terephthalic acid and/or isophthalic acid and the isomer mixture of 2,2,4- and 2,4,4-trimethylhexamethylenediamine,
- the polyamide of isophthalic acid and 1,6-hexamethylenediamine,
- the copolyamide of a mixture of terephthalic acid/isophthalic acid and 1,6-hexamethylenediamine, optionally in a mixture with 4,4'-diaminodicyclohexylmethane,
- the copolyamide of terephthalic acid and/or isophthalic acid, 3,3'-dimethyl-4,4'-diaminodicyclohexylmethane and laurolactam or caprolactam,
- the (co)polyamide of 1,12-dodecanedioic acid or sebacic acid, 3,3'-dimethyl-4,4'-diaminodicyclohexylmethane, and optionally lauro-lactam or caprolactam,
- the copolyamide of isophthalic acid, 4,4'-diaminodicyclohexylmethane and laurolactam or caprolactam,
- the polyamide of 1,12-dodecanedioic acid and 4,4'-diamino-dicyclohexylmethane (in the case of a low trans, trans isomer content),
- the (co)polyamide of terephthalic acid and/or isophthalic acid and an alkyl-substituted bis(4-aminocyclohexyl) methane homologue, optionally in a mixture with hexamethylenediamine,
- the copolyamide of bis(4-amino-3-methyl-5-ethylcyclohexyl)methane, optionally together with a further diamine, and isophthalic acid, optionally together with a further dicarboxylic acid,
- the copolyamide of a mixture of m-xylylenediamine and a further diamine, e.g. hexamethylenediamine, and isophthalic acid, optionally together with a further dicarboxylic acid, for example terephthalic acid and/or 2,6-naphthalenedicarboxylic acid,
- the copolyamide of a mixture of bis(4-aminocyclohexyl) methane and bis(4-amino-3-methylcyclohexyl)methane, and aliphatic dicarboxylic acids having 8 to 14 carbon atoms, and
- polyamides or copolyamides of a mixture comprising 1,14-tetradecanedioic acid and an aromatic, arylaliphatic or cycloaliphatic diamine.

These examples may be varied to a very substantial degree by addition of further components (for example caprolactam, laurolactam or diamine/dicarboxylic acid combinations) or by partial or full replacement of starting components by other components.

The polyamide may also be a polyetheresteramide or a polyetheramide. Polyetheresteramides are described in DE-A-25 23 991 and DE-A-27 12 987; they contain a polyether diol as a comonomer. Polyetheramides are described in DE-A-30 06 961; they contain a polyether diamine as a comonomer.

In the polyether diol or the polyether diamine, the polyether unit may be based, for example, on 1,2-ethanediol, 1,2-propanediol, 1,3-propanediol, 1,4-butanediol or 1,3-butanediol. The polyether unit may also be of mixed structure, for instance with random or blockwise distribution of the units originating from the diols. The weight-average molar mass of the polyether diols or polyether diamines is 200 to 5000 g/mol and preferably 400 to 3000 g/mol; the proportion thereof in the polyetheresteramide or polyetheramide is preferably 4 to 60% by weight and more preferably 10 to 50% by weight. Suitable polyether diamines are obtainable by conversion of the corresponding polyether diols by reductive amination or coupling to acrylonitrile with subsequent hydrogenation; they are commercially available, for example, in the form of the JEFFAMINE® D or ED products or of the ELASTAMINE® products from Huntsman Corp., or in the form of the Polyetheramine D series from BASF SE. It is also possible to additionally use smaller amounts of a polyether triamine, for example a JEFFAMINE® T product, if a branched polyetheramide is to be used. Preference is given to using polyether diamines or polyether triamines which contain an average of at least 2.3 carbon atoms in the chain per ether oxygen atom. According to the invention, polyetheramides are preferred due to better hydrolysis resistance.

The polypropylene may in principle be any commercially customary type of polypropylene, examples being isotactic or syndiotactic homopolypropylene, a random copolymer of propene with ethene and/or but-1-ene, a propene-ethene block copolymer and the like. The polypropylene may be prepared by any known process, as for example by a Ziegler-Natta method or by means of metallocene catalysis. It may be possible for there to be an impact-modifying component present, such as EPM rubber or EPDM rubber or SEBS, for example. The polypropylene may preferably be a propene-ethene block copolymer, frequently also referred to as a heterophase copolymer. Heterophase copolymers of this kind may be prepared, for example, in a two-phase procedure, the course of which runs approximately as follows: first of all, using a Ziegler-Natta catalyst, for example, a highly isotactic polypropylene is prepared, it being possible in certain circumstances for a small amount of ethene to be present, producing a random copolymer. This material functions as the matrix of a heterophase copolymer. In a second reaction step (optionally in a different reactor), a second catalyst may optionally be introduced, e.g. a metallocene catalyst. Then a copolymerization of ethene with propene takes place, this polymerization occurring in cavities in the first polymer. As a result, the second polymer is incorporated there. In one preferred embodiment, the block copolymer or heterophase copolymer contains, in copolymerized form, at least 0.5%, at least 0.6%, at least 0.7%, at least 0.8% or at least 0.9% by weight, and also not more than 20%, not more than 15%, not more than 12%, not more than 10% or not more than 8% by weight, of ethene. Furthermore, up to 15% by weight of 1-butene may be incorporated in copolymerized form.

The moulding composition of the layer according to a) may comprise either one of the abovementioned polyamides or a plurality thereof as a mixture. In addition, up to 40% by weight, based on the total polymer content of the moulding composition, of other thermoplastics may be present, for example impact-modifying rubbers or polyolefins such as polyethylene or polypropylene. Any rubbers or polyolefins present preferably comprise functional groups with which compatibility with the polyamide matrix may be obtained. In addition, the assistants and additives customary for polyamides may be present, especially light and/or heat stabilizers, or preferably also light-reflecting fillers, for example titanium dioxide (WO 2011066595).

The moulding composition of the layer according to c) may comprise the assistants and additives customary for polypropylene, especially light and/or heat stabilizers, light-reflecting fillers, for example titanium dioxide, and reinforcing fillers, for example glass fibres, wollastonite or mica.

For the moulding composition of the layer according to e), the same applies as for the moulding composition of the layer according to a), and also, with regard to fillers, the same as for the moulding composition of the layer according to c). In addition, the moulding composition of the layer according to e) may be coloured and/or have a matting agent.

The individual film layers preferably have the following thicknesses:

layers according to a) and e): 15 to 100 μm and more preferably 25 to 50 μm;
layer according to c): 100 to 500 μm and more preferably 150 to 400 μm;
layers according to b) and d): 3 to 40 μm and more preferably 5 to 25 μm.

The multilayer film used in accordance with the invention can be produced by all conventionally known methods, including, for example, coextrusion or lamination. It may be bonded to the sealing layer into which the solar cell is embedded, for example, by lamination or adhesive bonding. Due to the polyamide content in the layer according to a), good adhesion to the sealing layer may be obtained in the case of lamination. The sealing layer used may be any material commonly used for such purpose.

The present invention also provides a photovoltaic module which has been produced using the multilayer film according to the claims.

Having generally described this invention, a further understanding can be obtained by reference to certain specific examples which are provided herein for purposes of illustration only, and are not intended to be limiting unless otherwise specified.

EXAMPLES

The following moulding compositions were produced; "parts" are always parts by weight.

Compound 1 for Outer Layers:
79.25 parts of VESTAMID® L1901 of (PA12), 0.5 part of IRGANOX® 1098 (a sterically hindered phenolic antioxidant), 0.2 part of TINUVIN® 312 (UV absorber) and 20 parts of the titanium dioxide Sachtleben R 420 were mixed with the aid of a twin-screw extruder (Coperion Werner & Pfleiderer ZSK 25 WLE, 36 L/D) at a barrel temperature of 220° C. The extrudate was cooled with the aid of a water bath and chopped; the pellets were subsequently dried in a forced-air oven at 80° C. for 12 hours.

Compound 2 for Middle Layer:
79.6 parts of Hostalen® EPD60R (propylene-ethylene block copolymer), 20 parts of TEC 110 kaolin and 0.4 part of IRGANOX® 1010 (sterically hindered phenolic antioxidant) were mixed with the aid of a twin-screw extruder (Coperion Werner & Pfleiderer ZSK 25 WLE, 36 L/D) at a barrel temperature of 200° C. The extrudate was cooled with the aid of a water bath and chopped; the pellets were subsequently dried in a forced-air oven at 80° C. for 12 hours.

Compound 3 for Middle Layer:
75.6 parts of Hostalen® EPD60R, 4 parts of LOTADER® AX 8900 (terpolymer of ethylene, methyl acrylate and glycidyl methacrylate), 20 parts of TEC 110 kaolin and 0.4 part of IRGANOX® 1010 were mixed with the aid of a twin-screw extruder (Coperion Werner & Pfleiderer ZSK 25 WLE, 36 L/D) at a barrel temperature of 200° C. The extrudate was cooled with the aid of a water bath and chopped; the pellets were subsequently dried in a forced-air oven at 80° C. for 12 hours.

Compound 4 for Middle Layer:
43.6 parts of VESTAMID® L1901, 32 parts of Hostalen® EPD60%, 4 parts of LOTADER® AX 8900, 20 parts of TEC 110 kaolin and 0.4 part of IRGANOX® 1010 were mixed with the aid of a twin-screw extruder (Coperion Werner & Pfleiderer ZSK 25 WLE, 36 L/D) at a barrel temperature of 200° C. The extrudate was cooled with the aid of a water bath and chopped; the pellets were subsequently dried in a forced-air oven at 80° C. for 12 hours.

Compound 5 for Adhesion Promoter Layer:
95.6 parts of Hostalen® EPD60R, 4 parts of LOTADER® AX 8900, and 0.4 part of IRGANOX® 1010 were mixed with the aid of a twin-screw extruder (Coperion Werner & Pfleiderer ZSK 25 WLE, 36 L/D) at a barrel temperature of 200° C. The extrudate was cooled with the aid of a water bath and chopped; the pellets were subsequently dried in a forced-air oven at 80° C. for 12 hours.

Extrusion of Multilayer Films:
A multilayer film system from Collin (300 mm slot die, gap width 0-6 mm, co-extrusion feed block for 3-layer or 5-layer films) was used to produce three- and five-layer films (processing temperature for middle layer and adhesion promoter layers approx. 210° C., and for outer layers approx. 230° C.). The layer thickness distribution was set as follows:

a/c/e: 50 μm/250 μm/50 μm
a/b/c/d/e: 50 μm/10 μm/230 μm/10 μm/50 μm

The results are shown in Table 1.

TABLE 1

| | Examples | |
|---|---|---|
| | Layer structure | Breakdown (kv) |
| Example 1 | Compound 1/Compound 3/Compound 1 | 24 |
| Example 2 | Compound 1/Compound 5/Compound 2/Compound 5/Compound 1 | 25 |
| Comparative Example 1 | Compound 1/Compound 4/Compound 1 | 20 |

Numerous modifications and variations on the present invention are possible in light of the above description. It is therefore to be understood that within the scope of the appended claims, the invention may be practiced otherwise than as specifically described herein.

The invention claimed is:

1. A multilayer film, comprising, in the order listed:
a) a layer of a moulding composition which comprises at least 35% by weight, based on the overall layer moulding composition, of polyamide;
c) a layer of a moulding composition which comprises at least 35% by weight, based on the overall layer moulding composition, of a polypropylene;
e) a layer of a moulding composition which comprises at least 35% by weight, based on the overall moulding composition, of polyamide;
wherein
the layer c) further comprises a polypropylene having from 0.1 to 4% by weight of a copolymerized unsaturated anhydride, or
the layer c) further comprises a polypropylene compatible functionalized polyolefin which is selected from the group consisting of copolymers comprising at least 2 of ethylene, methyl acrylate and ethylacrylate which are functionalized with glycidyl methacrylate, maleic anhydride or a mixture thereof.

2. The multilayer film according to claim 1, wherein a thickness of the layer c) is from 100 to 500 μm.

3. The multilayer film according to claim 1, wherein a thickness of each of the layers a) and e) is independently from 15 to 100 μm.

4. The multilayer film according to claim 2, wherein a thickness of each of the layers a) and e) is independently from 15 to 100 μm.

5. The multilayer film according to claim 1, wherein the polyamide comprises at least one selected from the group consisting of a partly crystalline polyamide having an enthalpy of fusion of more than 25 J/g, a semicrystalline polyamide having an enthalpy of fusion of from 4 to 25 J/g and an amorphous polyamide having an enthalpy of fusion of less than 4 J/g.

6. The multilayer film according to claim 1 wherein the layer a), the layer c) or both layer a) and layer c) further comprise an impact-modifying rubber optionally modified with a polyamide compatible functional group.

7. A photovoltaic module, comprising;
a solar cell embedded in a sealing layer; and
the laminate film according to claim 1 as a back cover;
wherein the layer a) of the multilayer film is bonded to the sealing layer.

8. The photovoltaic module according to claim 7, wherein a thickness of the layer c) is from 100 to 500 μm.

9. The photovoltaic module according to claim 7, wherein a thickness of the layer a) and the layer e) is from 15 to 100 μm.

10. The photovoltaic module according to claim 8, wherein a thickness of the layer a) and the layer e) is from 15 to 100 μm.

11. The photovoltaic module according to claim 7, wherein the layer a), the layer c) or both layer a) and layer c) further comprise an impact-modifying rubber optionally modified with a polyamide compatible functional group.

12. A multilayer film, comprising, in the order listed:
a) a layer of a moulding composition which comprises at least 35% by weight, based on the overall layer moulding composition, of polyamide;
b) an adhesion promoter layer;
c) a layer of a moulding composition which comprises at least 35% by weight, based on the overall layer moulding composition, of a polypropylene;
d) an adhesion promoter layer; and
e) a layer of a moulding composition which comprises at least 35% by weight, based on the overall moulding composition, of polyamide;
wherein
the adhesion promoter layers b) and d) each comprise a polypropylene functionalized with an unsaturated dicarboxylic anhydride, an unsaturated dicarboxylic acid or an unsaturated dicarboxylic acid monoalkyl ester sufficient to adhere to the layer c) and to each of layer a) and layer e).

13. The multilayer film according to claim 12 wherein the functionalized polypropylene comprises from 0.1 to 4% by weight of an unsaturated anhydride.

14. A photovoltaic module, comprising;
a solar cell embedded in a sealing layer; and
the multilayer film according to claim 12 as a back cover;
wherein the layer a) of the laminate film is bonded to the sealing layer.

15. The photovoltaic module according to claim 14, wherein a thickness of the layer c) is from 100 to 500 μm.

16. The photovoltaic module according to claim 14, wherein a thickness of the layer a) and the layer e) is from 15 to 100 μm.

17. The photovoltaic module according to claim 15, wherein a thickness of the layer a) and the layer e) is from 15 to 100 μm.

* * * * *